United States Patent
Lee et al.

(10) Patent No.: US 11,305,987 B2
(45) Date of Patent: Apr. 19, 2022

(54) SYSTEM AND METHODS FOR MICROFABRICATION

(71) Applicant: Beijing Voyager Technology Co., Ltd., Beijing (CN)

(72) Inventors: Sae Won Lee, Mountain View, CA (US); Qin Zhou, Mountain View, CA (US); Youmin Wang, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 0 days.

(21) Appl. No.: 17/360,128

(22) Filed: Jun. 28, 2021

(65) Prior Publication Data

US 2021/0323815 A1    Oct. 21, 2021

Related U.S. Application Data

(63) Continuation of application No. PCT/US2019/068742, filed on Dec. 27, 2019.

(60) Provisional application No. 62/786,227, filed on Dec. 28, 2018.

(51) Int. Cl.
| | |
|---|---|
| *B81C 1/00* | (2006.01) |
| *B81C 3/00* | (2006.01) |
| *G02B 26/08* | (2006.01) |
| *G01S 17/931* | (2020.01) |

(52) U.S. Cl.
CPC .......... *B81C 1/00373* (2013.01); *B81C 3/004* (2013.01); *G02B 26/0833* (2013.01);
(Continued)

(58) Field of Classification Search
CPC .............. B81C 1/00373; B81C 3/004; B81C 2201/0187; B81C 2203/051;
(Continued)

(56) References Cited

U.S. PATENT DOCUMENTS

| | | | |
|---|---|---|---|
| 10,908,409 B2 * | 2/2021 | Zhou | G01S 17/931 |
| 2003/0027342 A1 * | 2/2003 | Sheridan | G02B 21/34 |
| | | | 436/43 |

(Continued)

FOREIGN PATENT DOCUMENTS

| | | |
|---|---|---|
| CN | 104320567 A | 1/2015 |
| WO | 2018126248 A1 | 5/2018 |

OTHER PUBLICATIONS

PCT/US2019/068742, "International Preliminary Report on Patentability", dated Jul. 8, 2021, 8 pages.

(Continued)

*Primary Examiner* — Yasser A Abdelaziez
(74) *Attorney, Agent, or Firm* — Kilpatrick Townsend & Stockton LLP

(57) ABSTRACT

A method comprising: adhering a first surface of a mask to a carrier substrate via a first adhesive layer; forming a second adhesive layer on at least one of a second surface of the mask or a third surface of a wafer having a second alignment mark; bringing the carrier substrate and the wafer towards each other along a vertical axis such that the second surface of the mask and the third surface of the wafer is separated by an alignment gap based on a thickness of the second adhesive layer; performing an alignment operation based on imaging the first alignment mark and the second alignment mark; configuring the second surface of the mask to adhere to the third surface of the wafer via the second adhesive; and disconnecting the carrier substrate from the mask.

20 Claims, 11 Drawing Sheets

(52) U.S. Cl.
CPC .............. *B81C 2201/0187* (2013.01); *B81C 2203/051* (2013.01); *G01S 17/931* (2020.01)

(58) Field of Classification Search
CPC ........ B81C 2201/0194; G02B 26/0833; G02B 26/101; G01S 17/931; G01S 7/4811; C23C 16/042; C23C 14/042
See application file for complete search history.

(56) References Cited

U.S. PATENT DOCUMENTS

| | | | | |
|---|---|---|---|---|
| 2007/0014920 | A1* | 1/2007 | Syms | G03F 7/0002 |
| | | | | 427/256 |
| 2008/0273233 | A1* | 11/2008 | Pan | G02B 26/0833 |
| | | | | 359/223.1 |
| 2009/0251699 | A1* | 10/2009 | George | H01L 23/544 |
| | | | | 356/401 |
| 2011/0253314 | A1* | 10/2011 | George | H01L 21/6835 |
| | | | | 156/706 |
| 2014/0147949 | A1 | 5/2014 | Hong | |
| 2016/0204451 | A1 | 7/2016 | Kwak et al. | |
| 2018/0363127 | A1 | 12/2018 | Bucci | |

OTHER PUBLICATIONS

International Search Report and Written Opinion for PCT/US2019/068742, dated Mar. 9, 2020, 10 pages.

* cited by examiner

SYSTEM AND METHODS FOR MICROFABRICATION

CROSS REFERENCES TO RELATED APPLICATIONS

This application is a bypass continuation of PCT/US2019/068742, filed Dec. 27, 2019, and titled "SYSTEM AND METHODS FOR MICROFABRICATION," which claims priority to U.S. Patent Application No. 62/786,227, filed on Dec. 28, 2018, and titled "SYSTEM AND METHODS FOR MICROFABRICATION," the disclosures of which are hereby incorporated by reference in their entirety for all purposes.

BACKGROUND

The disclosure relates generally to microfabrication, and more specifically to the fabrication of Micro-Electro-Mechanical Systems (MEMS).

Microfabrication generally refers to the process of fabricating miniature structures which, depending on the process technology, can be of micrometer scales or smaller. The miniature structures may include, for example, a MEMS structure, which can include miniaturized mechanical and electromechanical elements such as micro-mirrors, actuators, etc. Materials of a MEMS structure may include, for example, silicon, polymers, metals, ceramics, etc. A MEMS structure is typically fabricated on a semiconductor substrate. The semiconductor which also includes transistor devices, such as metal-oxide-semiconductor field-effect transistors, as part of a controller to control the operations of the mechanical and electromethanical elements, to form a system. The fabrication of MEMS structures and transistor devices on the same semiconductor substrate allows integration of the miniaturized mechanical and electromechanical elements with the controller on a single integrated circuit, which can shrink the overall size and power of the system.

To fabricate a MEMS structure, layers of materials, such as metals, can be deposited on the semiconductor substrate. Each layer can be patterned to produce the required shapes for the elements of the MEMS structure. The patterning can be performed using various techniques, such as photolithography. With photolithography, a photoresist having a pattern can be deposited on top of the material to be patterned to cover certain areas while exposing the remaining areas. The material in the exposed areas can be removed to by etching to transfer the pattern. After etching, the photoresist can also be removed. While photolithography supports high precision patterning with small feature sizes, the application and development of photoresists become challenging when the microstructure to be fabricated is very fragile. For example, photolithography is not suitable for fabricating micro-mirrors, membranes, cantilevers, etc. which are fragile and susceptible to mechanical damage caused by the photoresist spinning and the associated thermal and chemical processing.

In addition to photolithography, the patterning can also be performed using a shadow mask. A shadow mask includes a pattern of openings and can be placed on top of the semiconductor substrate as a stencil. Materials, such as metals, can be deposited through the pattern of openings onto the semiconductor substrate. As photoresist is not needed for shadow mask patterning, the challenges associated with the application and development of photoresist for fragile microstructures can be avoided. Thus, shadow mask patterning can be very useful for fabricating fragile microstructures, such as micro-mirrors and the associated actuators. Moreover, shadow mask patterning requires fewer processing steps since some of the steps that follow photolithography, such as etching and removal of the photoresists, are not needed for shadow mask patterning, which can result in shorter processing time and lower processing cost.

Despite the numerous advantages of shadow mask patterning over photolithography, various factors can limit the application of shadow mask patterning. First, the shadow mask needs to be aligned with the semiconductor substrate at high precision to ensure proper pattern transfer. Low alignment precision can limit the achievable miniaturization of MEMS components, such that MEMS components smaller than certain sizes cannot be fabricated (within a certain tolerance for error) using shadow mask patterning. Moreover, it also challenging to maintain the shadow mask with the semiconductor substrate at their relative aligned positions during the deposition of the material. A fixture can be used to hold the shadow mask and the wafer containing the semiconductor substrate at their aligned positions, but such a fixture is large and heavy and is unsuitable to be put on certain manufacturing equipment, such as a rotating wafer holder, which can rotate the wafer to improve the uniformity of a deposition process.

BRIEF SUMMARY

In one embodiment, a method of microfabrication is provided. The method comprises: adhering a first surface of a mask to a carrier substrate via a first adhesive layer, at least one of the mask or the carrier substrate having a first alignment mark, the mask having a pattern of openings; forming a second adhesive layer on at least one of a second surface of the mask or a third surface of a wafer having a second alignment mark, the second surface being on an opposite side of the mask relative to first surface, the wafer having a second alignment mark, the second surface and the third surface being kept parallel with each other by a plurality of proximity flags, the proximity flags not in contact with the second adhesive layer; removing the proximity flags; bringing the carrier substrate and the wafer towards each other along a vertical axis such that the second surface of the mask and the third surface of the wafer is separated by an alignment gap based on a thickness of the second adhesive layer; performing an alignment operation based on imaging the first alignment mark and the second alignment mark, the alignment operation comprising moving at least one of the carrier substrate or the wafer on a horizontal plane perpendicular to the vertical axis when the mask is separated from the third surface by the distance; after the alignment operation completes: bringing the carrier substrate and wafer towards each other along the vertical axis such that the second surface of the mask adheres to the third surface of the wafer via the second adhesive; disconnecting the carrier substrate from the mask based on weakening the first adhesive layer when the mask remains adhered to the third surface via the second adhesive layer; depositing material via the pattern of openings of the mask to form a pattern of material on the third surface of the wafer; and after forming the pattern of material on the third surface, disconnecting the mask from the third surface based on weakening the second adhesive layer.

In some aspects, the carrier substrate comprises a material that transmits visible light.

In some aspects, the carrier substrate comprises glass.

In some aspects, the method further comprises: forming the first adhesive layer on the first surface of the mask; and bringing the mask and the carrier substrate together such that the first adhesive layer adheres the first surface of the mask to the carrier substrate.

In some aspects, the method further comprises: forming the first adhesive layer on a surface of carrier substrate facing the first surface of the mask; and bringing the mask and the carrier substrate together such that the first adhesive layer adheres the first surface of the mask to the carrier substrate.

In some aspects, the first adhesive layer and the second adhesive layer have different adhesion strength.

In some aspects, the first adhesive layer is weakened by a first agent but not by a second agent. The second adhesive layer is weakened by the second agent but not by the first agent.

In some aspects, the first adhesive layer is weakened by a larger degree by a first agent than by a second agent, and the second adhesive layer is weakened by a larger degree by the second agent than by the first agent.

In some aspects, the first adhesive layer is a thermal tape and the second adhesive layer is an ultra-violet (UV) tape. In some aspects, the first adhesive layer is the UV tape and the second adhesive layer is the thermal tape.

In some aspects, weakening the first adhesive layer comprising breaking the first adhesive layer apart by applying a first force to at least one of the carrier substrate or the wafer. Weakening the second adhesive layer comprises breaking the second adhesive layer apart by applying a second force larger than a first force to at least one of the mask or the wafer.

In some aspects, bringing the carrier substrate and the wafer towards each other along a vertical axis comprises at least one of: controlling a movement of a carrier substrate holder attached to the carrier substrate along the vertical axis; or controlling a movement of a wafer holder attached to the wafer along the vertical axis.

In some aspects, the alignment operation comprises: obtaining, from an imaging device, images of the first alignment mark and the second alignment mark; determining, based on the images, an overlapping area between the first alignment mark and the second alignment mark; moving at least one of the carrier substrate or the wafer on the horizontal plane based on the overlapping area; and determining that the alignment operation completes based on the overlapping area exceeding a threshold.

In some aspects, weakening the first adhesive layer comprises at least one of: projecting a UV light to the first adhesive layer via the carrier substrate, projecting a laser light to the first adhesive layer via the carrier substrate, heating the carrier substrate, or by a first force that separates the mask from the carrier substrate.

In some aspects, weakening the second adhesive layer comprises at least one of: projecting a UV light to the second adhesive layer via the mask, projecting a laser light to the second adhesive layer via the mask, heating the mask, or by a second force that separates the mask from the wafer.

In some aspects, the material is deposited using at least one of: a physical deposition process, or a chemical vapor deposition process.

In some aspects, the material is a metal.

In some aspects, the mask is made of: stainless steel, glass, plastic, or a semiconductor material.

In some aspects, the mask is a shadow mask.

In some aspects, the carrier template is made of glass.

In some aspects, the proximity flags comprise wedge error compensation (WEC) balls.

In some embodiments, an integrated circuit is provided. The integrated circuit comprises an array of micro-mirror assemblies fabricated using the various embodiments of the microfabrication methods described throughout this disclosure.

BRIEF DESCRIPTION OF THE DRAWINGS

The detailed description is set forth with reference to the accompanying figures.

DETAILED DESCRIPTION

In the following description, various techniques of microfabrication will be used. The microfabrication technique can be used to fabricate, for example, micro-minors and actuators of a ranging system. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

Patterning is a critical step of to fabricate a MEMS system. As part of the microfabrication process, layers of materials, such as metals, can be deposited on the semiconductor substrate. Each layer can be patterned to produce the required shapes for the elements of the MEMS structure. The patterning can be performed using various techniques, such as shadow mask patterning. A shadow mask includes a pattern of openings and can be placed on top of the semiconductor substrate as a stencil. Materials, such as metals, can be deposited through the pattern of openings onto the semiconductor substrate. Shadow mask patterning can be very useful for fabricating fragile microstructures, such as micro-mirrors and the associated actuators of a ranging system, while providing shorter processing time and lower cost.

To use a shadow mask to transfer a pattern onto a semiconductor substrate, the shadow mask needs to be aligned with the semiconductor substrate. But the alignment requirement poses numerous challenges. First, the alignment precision limits the degree of achievable miniaturization of MEMS components. For example, with a lower alignment precision, larger errors can be introduced to the patterning operations. As a result, shadow mask can be used only for fabrication of components of larger sizes and for low resolution applications, both of which have much higher tolerances for errors. Moreover, a fixture may be provided to hold both the shadow mask and the wafer containing the semiconductor substrate at their relative aligned positions, but such a fixture is large and heavy and is unsuitable to be put on certain manufacturing equipment, such as a rotating wafer holder. A rotating wafer holder can rotate the wafer during a deposition process to promote uniformity in the deposition process by, for example, providing greater temperature uniformity over the surface of the wafer, enhanced contact between the wafer and the particles of the material to be deposited, etc. Without the use of a rotating wafer holder, the uniformity of the deposition process can be reduced, which can lead to formation of components of uneven thicknesses.

Conceptual Overview of Certain Embodiments

Figure 6:
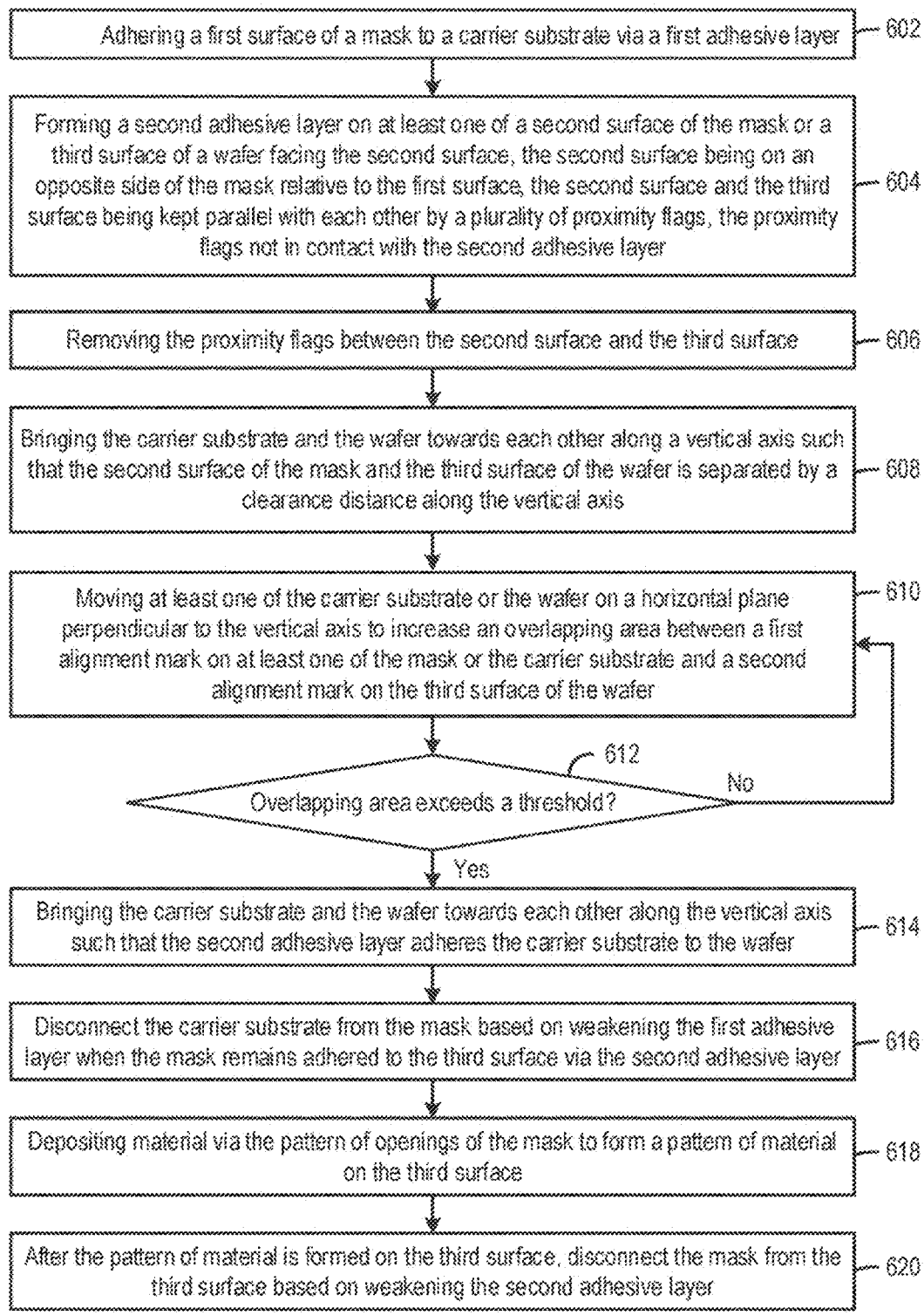
FIG. 6 illustrates a flowchart of patterning process, according to embodiments of the present disclosure.
Figure 7A:
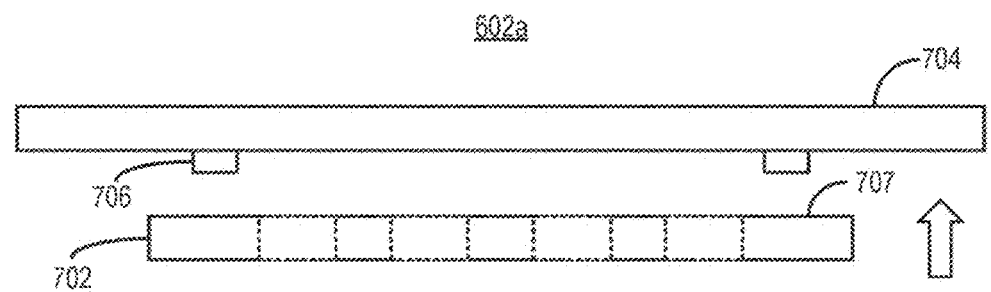
FIG. 7A-FIG. 7D provide side views of devices involved in the patterning process of FIG. 6.
Figure 7A:
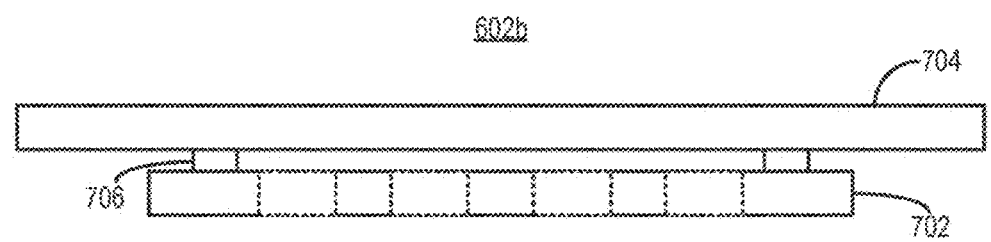
Figure 7B:
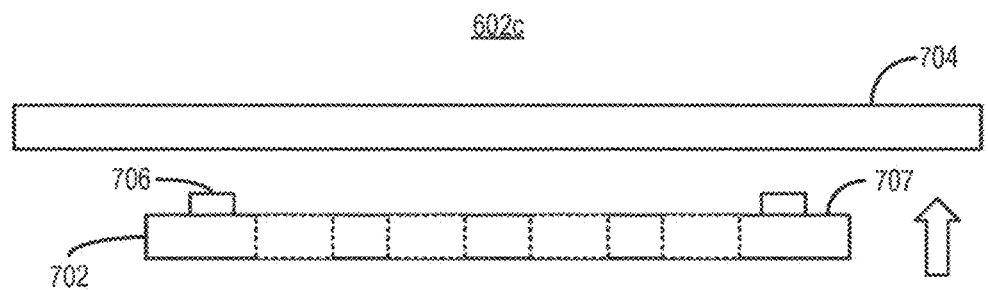
Figure 7B:
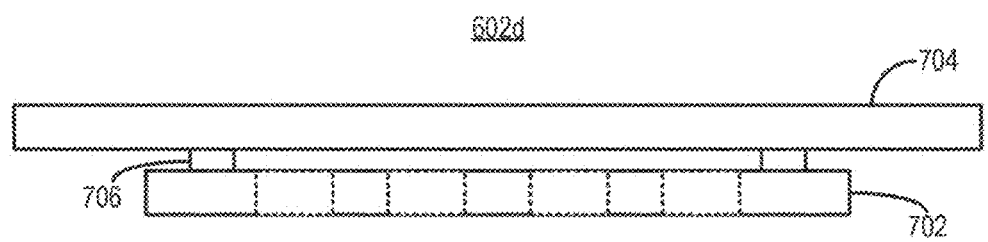

Examples of the present disclosure relate to a patterning process that can address the problems described above. The process can be part of a microfabrication process to fabricate MEMS systems such as micro-minors and actuators of a ranging system. FIG. 6 and FIG. 7A-FIG. 7D illustrate embodiments of the patterning process. As shown in FIG. 6 and FIGS. 7A-7B various embodiments of the patterning process involve adhering a mask to a carrier substrate via a first adhesive layer. The mask can be a shadow mask having a pattern of openings. The mask can be made of various materials including, for example, metals (e.g., stainless steel), glass, plastic, a semiconductor material (e.g., silicon), etc. The carrier substrate can be made of transparent material, such as glass, to facilitate subsequent an alignment process as to be described below. In some embodiments, as shown in FIG. 7A, the first adhesive layer can be formed on a first surface of the mask. In some embodiments, as shown in FIG. 7B, the first adhesive layer can be formed on a surface of the carrier substrate facing the first surface of the mask. In both cases, the mask and the carrier substrate can be brought towards each other, to enable the first adhesive layer to adhere the mask to the carrier substrate.

Figure 7C:
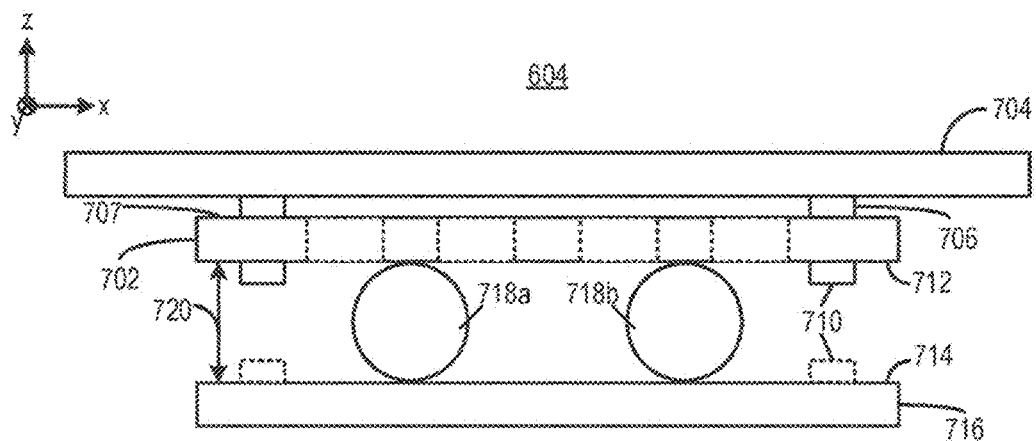
Figure 7C:
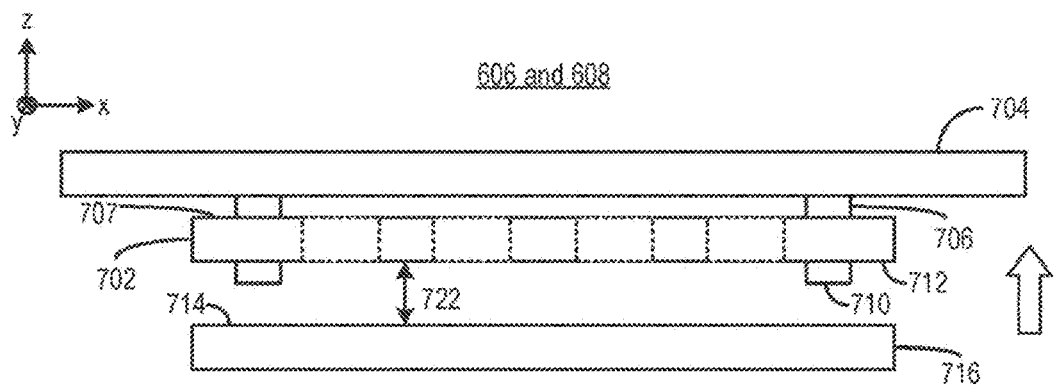
Figure 7C:
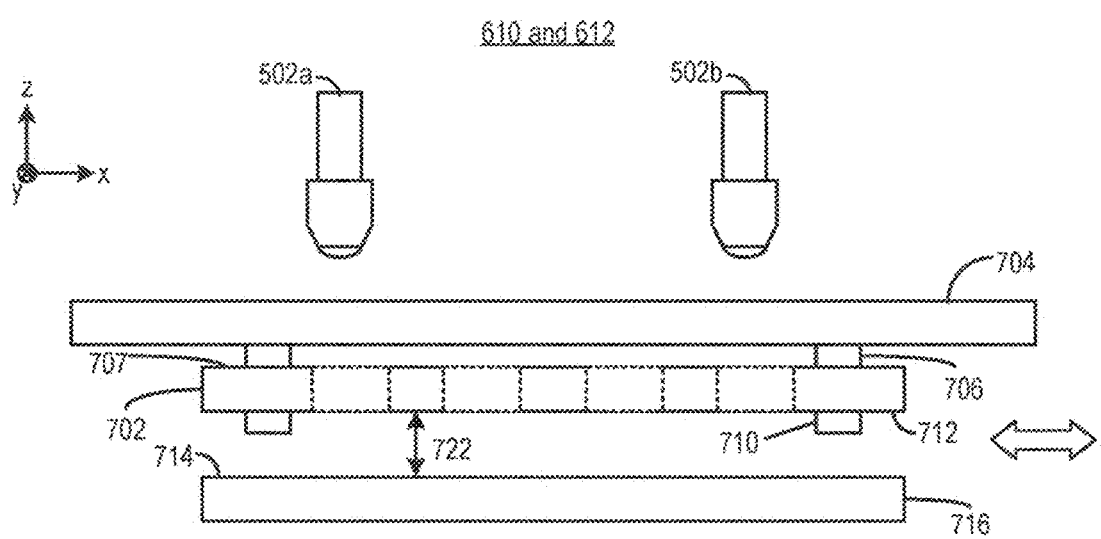

With the mask adhered to the carrier substrate via the first adhesive layer, a second adhesive layer can be formed on at least one of a second surface of the mask on an opposite side of the mask than the first surface, or a third surface of a wafer facing the second surface, as shown in FIG. 7C. The second adhesive layer can be used to adhere the mask to a semiconductor substrate at an aligned position, as to be described below. The second surface of the mask and the third surface of the wafer can be kept parallel with each other by a plurality of wedge error compensation (WEC) balls, which can act as proximity flags. Each of the WEC balls can have the same diameter and can be in contact with different locations on the second surface and of the third surface. The WEC balls can be positioned to avoid the opening patterns of the mask. The second adhesive layer can be formed at locations on the second surface and/or the third surface that are not in contact with the WEC balls.

In some examples, the first adhesive layer and the second adhesive layer can have different adhesive strengths, and/or the adhesiveness can be weakened by different agents/methods, etc., to enable the disconnection of the mask from the carrier substrate while maintaining the adhesion of the mask to the semiconductor substrate at the aligned position. As an example, the first adhesive layer can be an ultra-violet (UV) tape of which the adhesiveness can be weakened by UV light projected through the transparent carrier substrate, whereas the second adhesive layer can be a thermal tape of which the adhesiveness can be weakened by heat. In some embodiments, the first adhesive layer can cover the entire area of the mask. One example of the UV tape can be Furukawa® UV tape UC-228 W-110. As another example, the second adhesive layer can have higher adhesive strength than the first adhesive layer, such that the second adhesive layer requires a larger force to break the layer than the first adhesive layer.

Following the formation of the second adhesive layer, an alignment operation can be performed to align the mask with the semiconductor substrate. As shown in FIG. 6 and FIG. 7C, the alignment operation can be guided by images of a first alignment mark on the mask (or on the carrier substrate) and a second alignment mark on a third surface of the semiconductor substrate. The images can be captured by an imaging system (e.g., cameras and microscopes) via the transparent carrier substrate. The carrier substrate can be attached to a carrier substrate holder, whereas a wafer containing the semiconductor substrate can be attached to a wafer holder. Both the carrier substrate holder and the wafer holder can connect to, respectively, the carrier substrate and the wafer using, for example, adhesives, suction cups, etc. The wafer holder can be a rotating wafer holder. In some embodiments, the imaging system, the carrier substrate holder, and the wafer holder can be part of a contact alignment tool.

As shown in FIG. 7C, prior to the alignment operation, at least one of the carrier substrate holder or the wafer holder can be operated to move the wafer towards the second surface of the mask, or vice versa, along a vertical axis until the second surface of mask and the third surface of the semiconductor substrate is separated by an alignment gap along the vertical axis, after the WEC balls are removed. Reducing the distance between the second surface of mask and the third surface of the semiconductor substrate can improve the focus of the imaging of the first alignment marks and the second alignment marks, to facilitate the alignment operation. The distance of the alignment gap can be determined based on the maximum separation distance between the mask and the wafer for the imaging device to focus on the alignment marks of both the mask and the wafer, and based on a thickness of the second adhesive layer to prevent the second adhesive layer (or other parts of the second surface of the mask) from coming into contact with the third surface of the semiconductor substrate, to prevent introducing shear force on the mask which can disturb the alignment operation. A typical value of the alignment gap can be around 150 micro-meters (um). In some embodiments, the alignment gap can be monitored by, for example, a laser displacement sensor, by tracking a distance of movement of a linear motor/robotic arm coupled with the wafer holder and carrier substrate holder, or by other suitable measurement devices.

After the second surface of the mask and the third surface of the semiconductor substrate are brought together and separated by the alignment gap, the alignment operation can be performed. The alignment operation can involve moving at least one of the carrier substrate (by the carrier substrate holder) or the wafer (by the wafer holder) along a horizontal plane perpendicular to the vertical axis. As shown in FIG. 6, as part of the alignment operation, microscopic images of the first alignment mark and the second alignment mark can be captured (e.g., via cameras and microscopes), and a degree of alignment between the first alignment mark and the second alignment mark (e.g., a degree of overlap, similarity in sizes of the alignment marks, etc.) can be determined from the microscopic images. At least one of the carrier substrate (held together with the mask by the first adhesive layer) or the wafer comprising the semiconductor substrate can be moved to increase the degree of alignment reflected from the microscopic images, as shown in FIG. 7C. The alignment operation can stop when, for example, the degree of alignment reaches a threshold. In some embodiments, during the alignment operation, the imaging device (e.g., the microscope) can be configured to provide a relative low magnifying power.

Figure 7D:
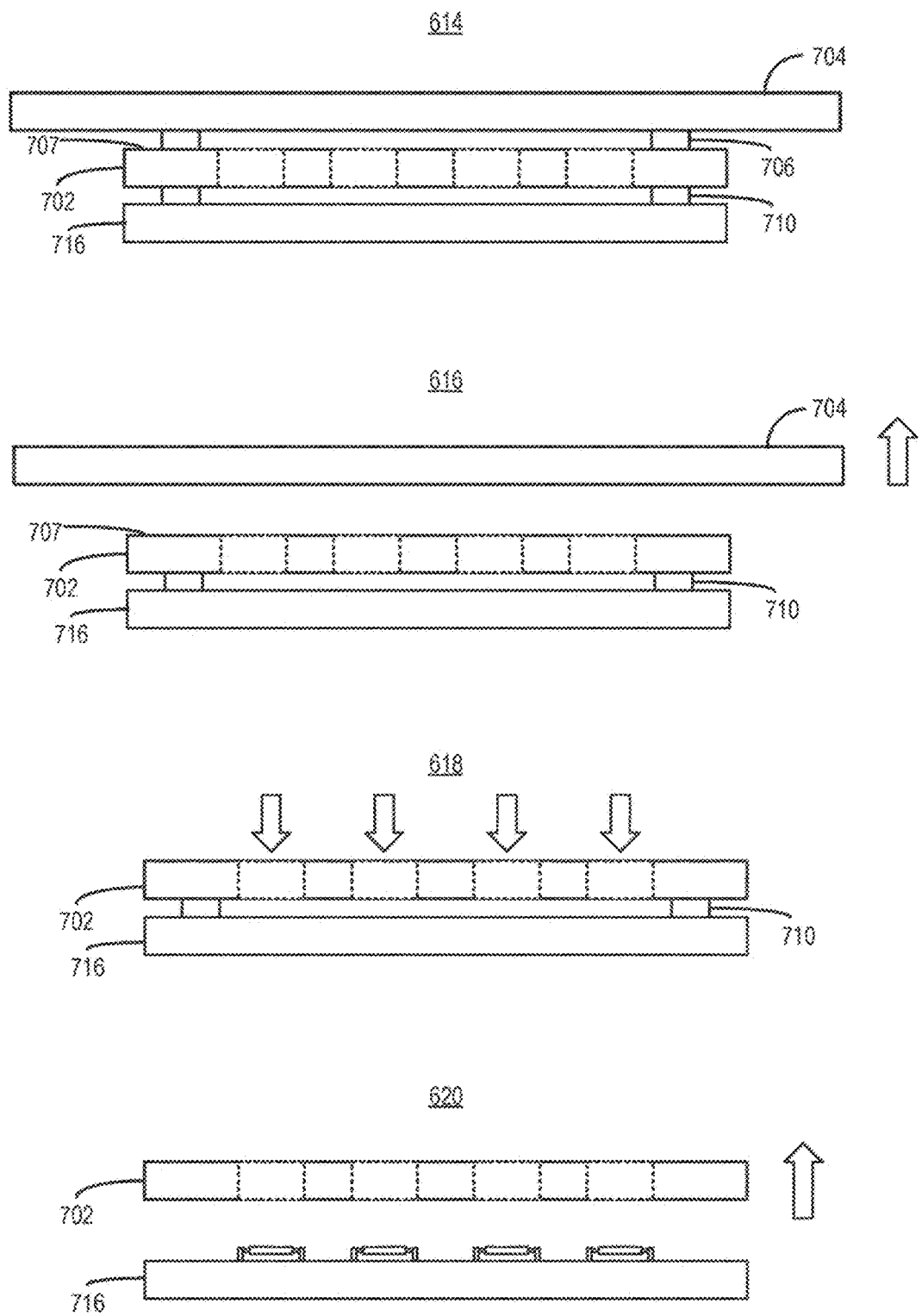

After the alignment operation stops, as shown in FIG. 7D, at least one of the carrier substrate holder or the wafer holder can be operated to move the wafer towards the second surface of the mask, or vice versa, along the vertical axis until the second adhesive layer contacts the third surface of the semiconductor substrate. The contacting allows the second surface of the mask to be adhered to the third surface of the semiconductor substrate via the second adhesive layer when the mask and the wafer are aligned. The mask and the semiconductor substrate can then be held together in their aligned positions by the second adhesive layer to prepare for the subsequent deposition operation.

With the second adhesive layer holding the mask and the semiconductor substrate together, the carrier substrate can be disconnected from the mask based on weakening the first adhesive layer, as shown in FIG. 7D. The first adhesive layer can be weakened by agents including, for example, heating, projecting UV light, laser light, etc. via the transparent carrier substrate, by a first force that separate the carrier substrate from the mask, etc. The agent may either do not weaken the second adhesive layer, or weaken the second adhesive layer to a smaller degree, so that the second adhesive layer holds the mask and the semiconductor substrate in their relative aligned positions. After the first adhesive layer is weakened, at least one of the carrier substrate holder or the wafer holder can be operated to move the wafer and the mask away from the carrier substrate, to disconnect the carrier substrate from the mask (and the wafer).

With the carrier substrate disconnected from the mask, a deposition process can be performed to deposit a material, such as a metal, via the pattern of openings of the mask to form a pattern of the material on the third surface of the semiconductor substrate, as shown in FIG. 5D. The deposition process can include, for example, a physical deposition process (e.g., evaporation, sputtering, spin-on, etc.), a chemical deposition process, etc.

After the deposition process completes, the mask can be disconnected from the semiconductor substrate based on weakening the second adhesive layer. In some examples, the second adhesive layer can be weakened by heating, UV light, another force to move the mask away from the wafer, etc., which is different from the agent that weakens the first adhesive layer. After the second adhesive layer is weakened, the carrier substrate holder can be operated to pull the mask away from the semiconductor substrate, as shown in FIG. 7D.

With the disclosed embodiments, a contact alignment tool can be used to improve the alignment precision between the mask and the semiconductor substrate, which can reduce the errors introduced by the shadow mask patterning operation. As a result, the shadow mask patterning operation can be used for fabrication of components of smaller sizes and for high resolution applications, both of which have low tolerances for errors. Moreover, with the mask adhered to the carrier substrate, the movement of the mask for the alignment operation can be performed by moving the carrier substrate. The carrier substrate can be made much larger than the mask to facilitate handling by the carrier substrate holder, while the size of the mask can be minimized. Further, as the mask and the wafer are held at their relative aligned positions using the adhesive layers, there is no need to use a fixture to hold the mask and the wafer at the aligned positions. As a result, the mask and the wafer can be placed on a rotating wafer holder, which can rotate the wafer to improve the uniformity of the deposition process, as described above. All these can improve the precision of the microfabrication process and allow shadow mask patterning to be used in the fabrication of a wide range of devices.

Typical Products To Be Fabricated Using Certain Embodiments

Figure 1:
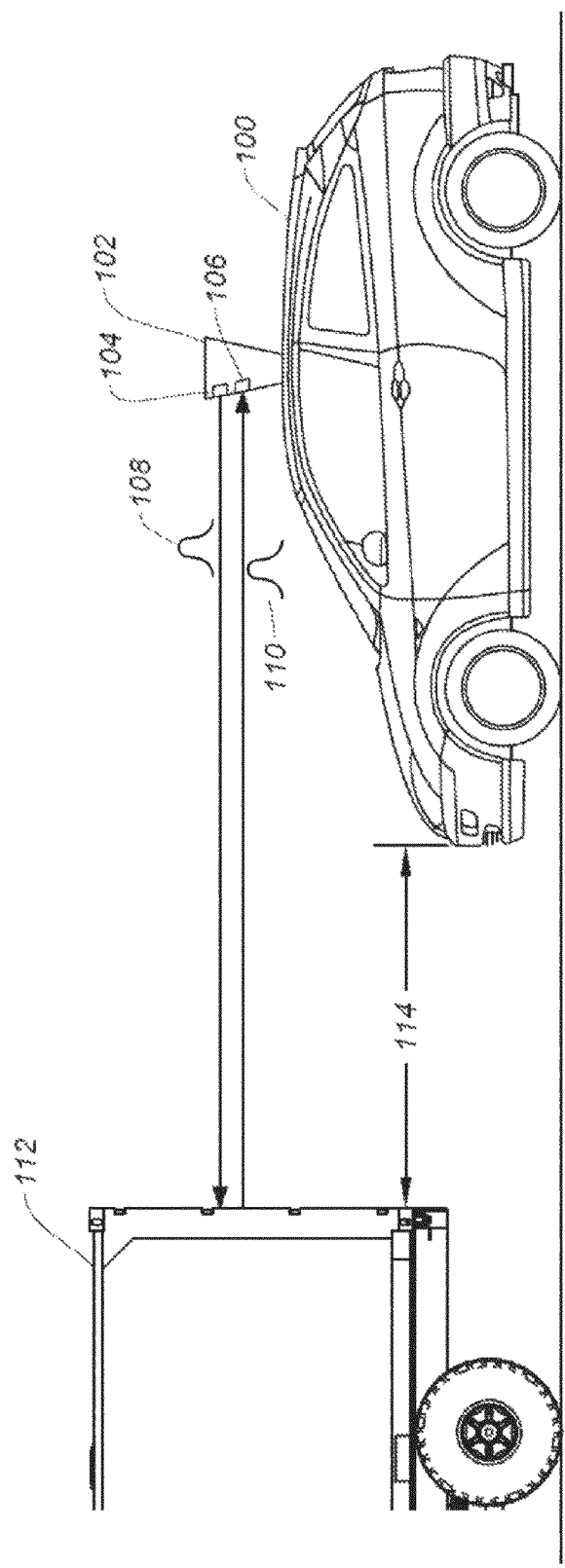
FIG. 1 shows an autonomous driving vehicle utilizing aspects of certain embodiments of the disclosed techniques herein.

FIG. 1 illustrates an autonomous vehicle 100 in which the disclosed techniques can be implemented. Autonomous vehicle 100 includes a ranging system, such as LiDAR module 102. LiDAR module 102 allows autonomous vehicle 100 to perform object detection and ranging in a surrounding environment. Based on the result of object detection and ranging, autonomous vehicle 100 can maneuver to avoid a collision with the object. LiDAR module 102 can include a light steering transmitter 104 and a receiver 106. Light steering transmitter 104 can project one or more light signals 108 at various directions at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, an amplitude modulated continuous wave (AMCW) signal, etc. LiDAR module 102 can detect the object based on the reception of light signal 110, and can perform a ranging determination (e.g., measuring a distance of the object) based on a time difference between light signals 108 and 110. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can adjust its speed (e.g., slowing or stopping) to avoid collision with object 112 based on the detection and ranging of object 112 by LiDAR module 102.

Figure 2A:
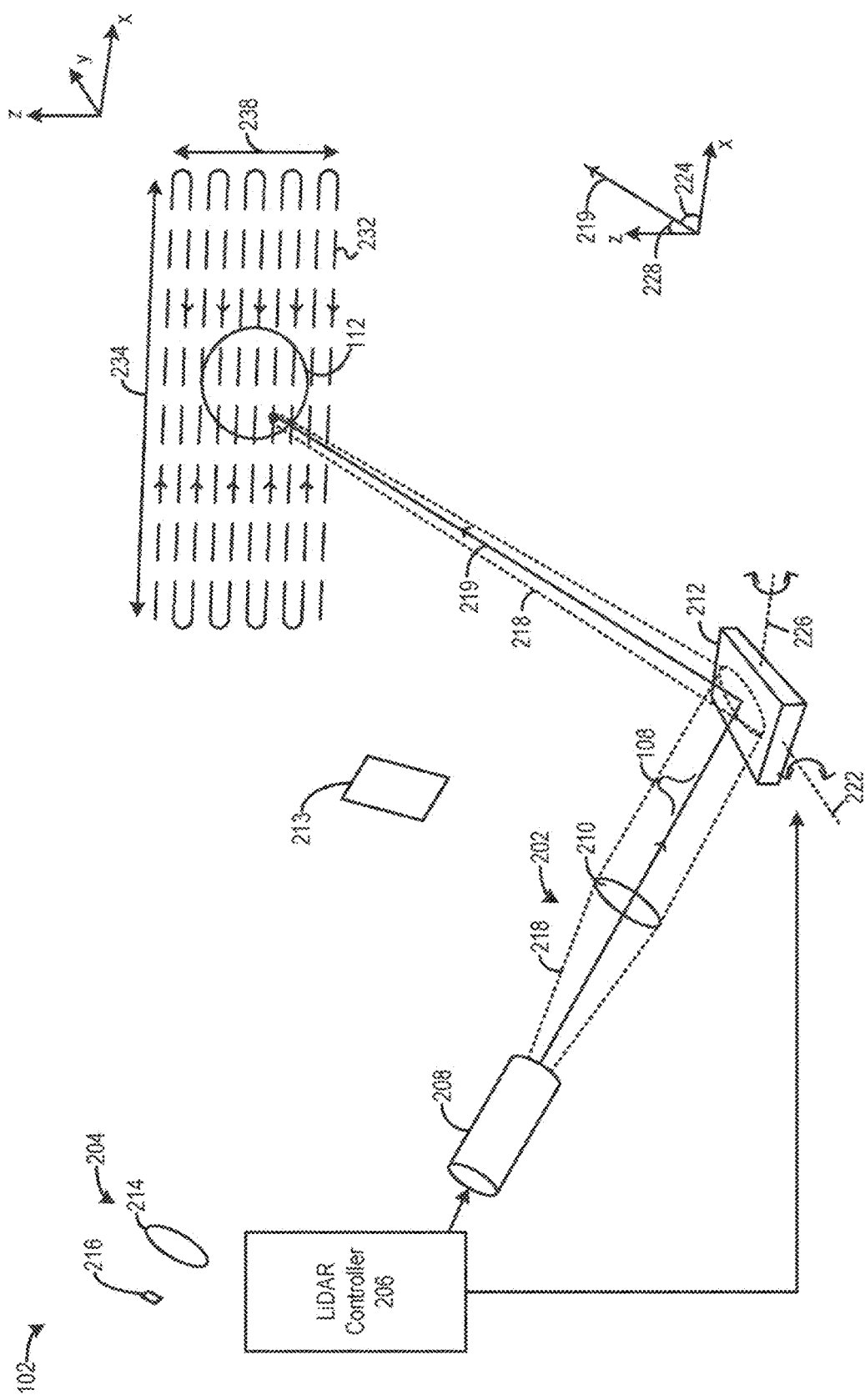
FIG. 2A and FIG. 2B illustrate examples of a ranging system that can be part of FIG. 1.
Figure 2B:
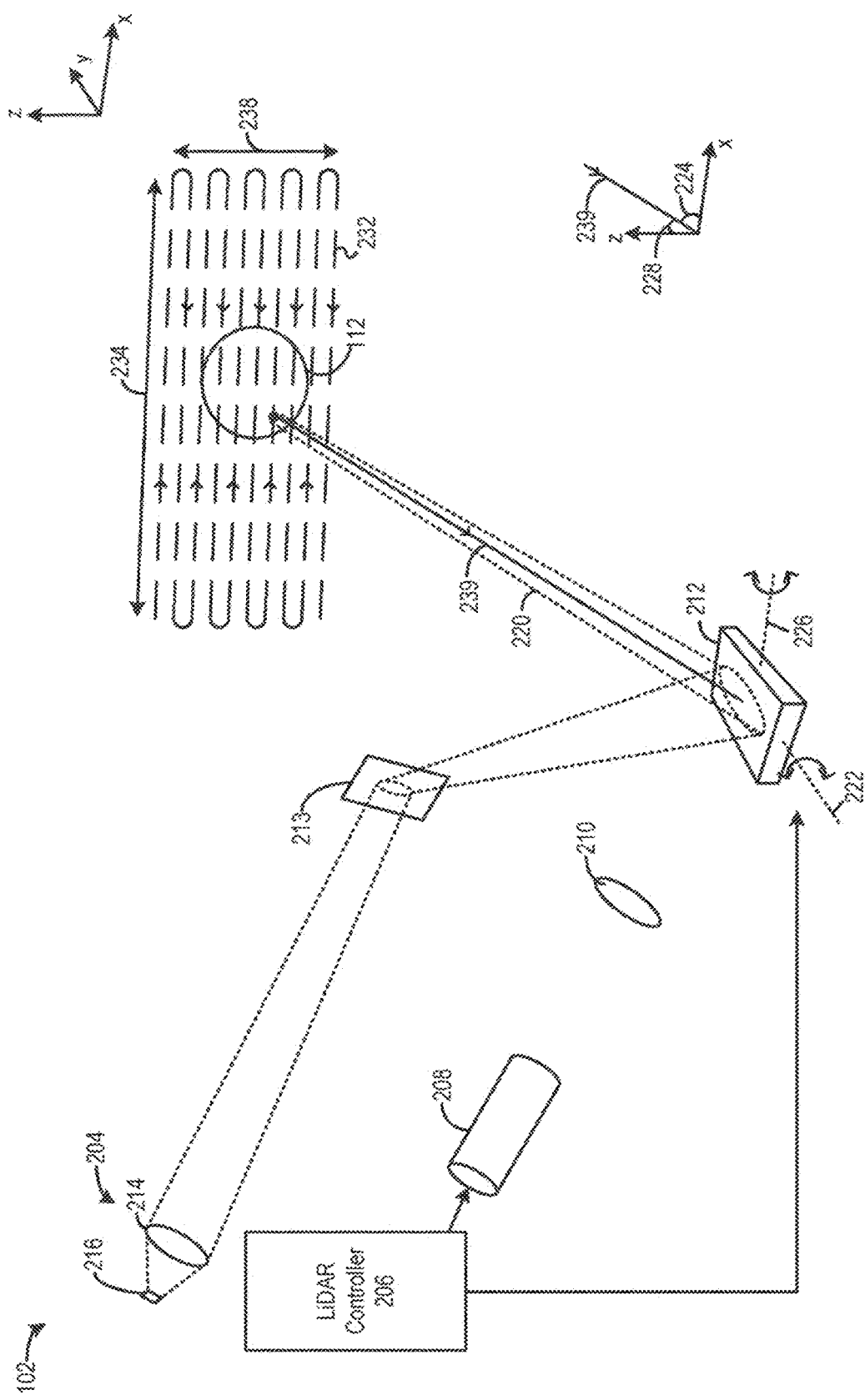

FIG. 2A and FIG. 2B illustrate examples of internal components of a LiDAR module 102. LiDAR module 102 includes a transmitter 202, a receiver 204, a LiDAR controller 206 which controls the operations of transmitter 202 and receiver 204. Transmitter 202 includes a light source 208 and a collimator lens 210, whereas receiver 204 includes a lens 214 and a photodetector 216. LiDAR module 102 further includes a mirror assembly 212 and a beam splitter 213. In LiDAR module 102, transmitter 202 and receiver 204 can be configured as a coaxial system to share mirror assembly 212 to perform light steering operation, with beam splitter 213 configured to reflect incident light reflected by mirror assembly 212 to receiver 204.

FIG. 2A illustrates a light projection operation. To project light, LiDAR controller 206 can control light source 208 (e.g., a pulsed laser diode, a source of FMCW signal, AMCW signal, etc.) to transmit light signal 108 as part of light beam 218. Light beam 218 can disperse upon leaving light source 208 and can be converted into collimated light beam 218 by collimator lens 210. Collimated light beam 218 can be incident upon mirror assembly 212, which can reflect and steer the light beam along an output projection path 219 towards object 112. Mirror assembly 212 can include one or more rotatable mirrors. FIG. 2A illustrates mirror assembly 212 as having one mirror, but as to be described below, in some embodiments mirror assembly 212 may include a plurality of mirrors. Mirror assembly 212 further includes one or more actuators (not shown in FIG. 2A) to rotate the rotatable mirrors. The actuators can rotate the rotatable mirrors around a first axis 222, and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form reflected light signal, which can be received by receiver 204.

FIG. 2B illustrates a light detection operation. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214. With such arrangements, receiver 204 can selectively receive signals that are relevant for the ranging/imaging of object 112, such as light signal 110 generated by the reflection of collimated light beam 218 by object 112, and not to receive other signals. As a result, the effect of environment disturbance on the ranging/imaging of the object can be reduced, and the system performance can be improved.

Figure 3:
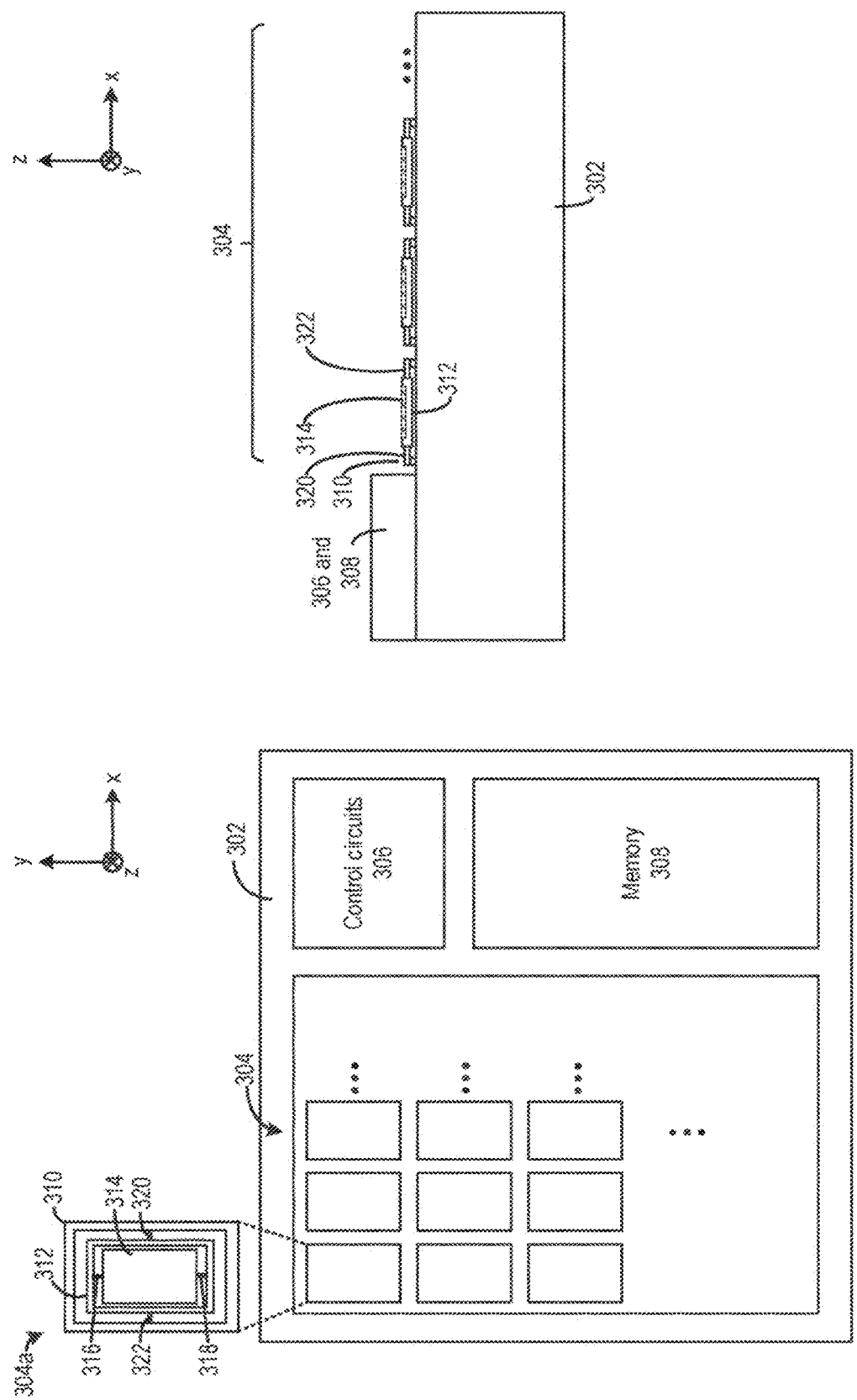
FIG. 3 illustrates an integrated circuit comprising the ranging system of FIG. 1 that can be fabricated using techniques according to embodiments of the present disclosure.

FIG. 3 illustrate an example of an integrated circuit 300 that can be part of LiDAR module 102. The left diagram of FIG. 3 shows a top view of integrated circuit 300, whereas the right diagram of FIG. 3 shows a side view of integrated circuit 300. As shown in FIG. 3, integrated circuit 300 can be implemented on a semiconductor substrate 302. Integrated circuit 300 includes an array of micro-mirror assemblies 304, control circuits 306, and memory 308. Each micro-mirror assembly of the array of micro-mirror assemblies 304 (e.g., mirror assembly 304a) may include an outer-frame 310, an inner-frame 312, and a micro-mirror 314 forming a gimbal structure. The micro-mirror assembly further includes connection structures 316 and 318 to couple micro-mirror 314 with inner-frame 312, and connection structures 320 and 322 to couple inner-frame 312 with outer-frame 310. The connection structures may include, for example, torsion bars. The micro-mirror assembly further include actuators (not shown in FIG. 3) to rotate inner-frame 312 with respect to outer-frame 310, and to rotate micro-mirror 314 with respect to inner-frame 312. The actuators may include, for example, comb drive, piezoelectric device, electromagnetic device, etc. Array of micro-mirror assemblies 304 can be MEMS devices implemented on semiconductor substrate 302 to enable integration of the micro-mirror assemblies, control circuits 306 and memory 308 on a single integrated circuit chip. In some examples, outer-frame 310, inner-frame 312, micro-mirror 314, as well as connection structures 316, 318, 320, and 322 can be formed as an unitary polysilicon structure. A layer of metal can be deposited on the polysilicon portion of micro-mirror 314 to form a reflective surface. In some examples, outer-frame 310, inner-frame 312, micro-mirror 314, as well as connection structures 316, 318, 320, and 322 can also be formed as multiple polysilicon structures.

Figure 4:
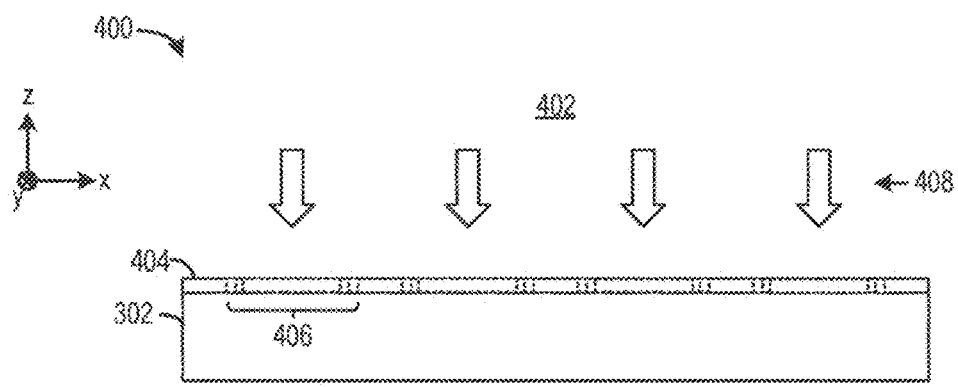
FIG. 4 provides side views of devices involved in an example microfabrication process that uses techniques according to embodiments of the present disclosure.
Figure 4:
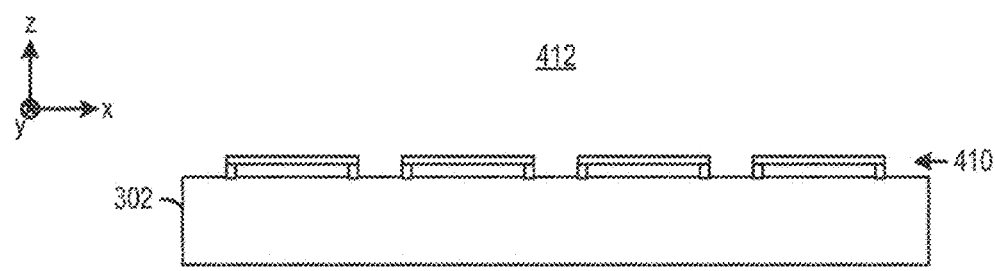
Figure 4:
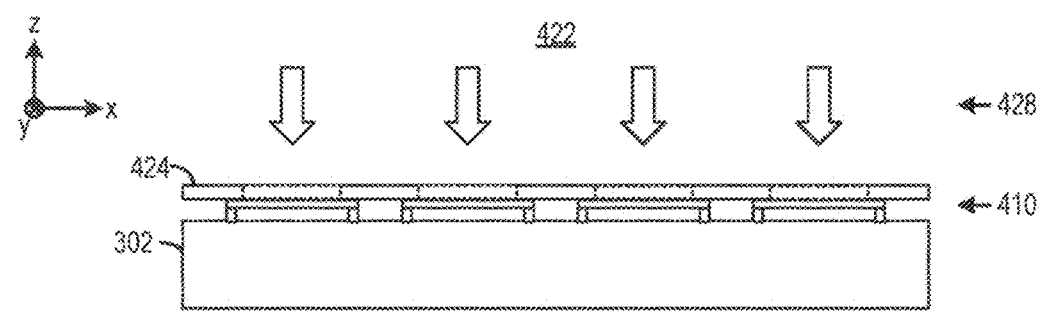
Figure 4:
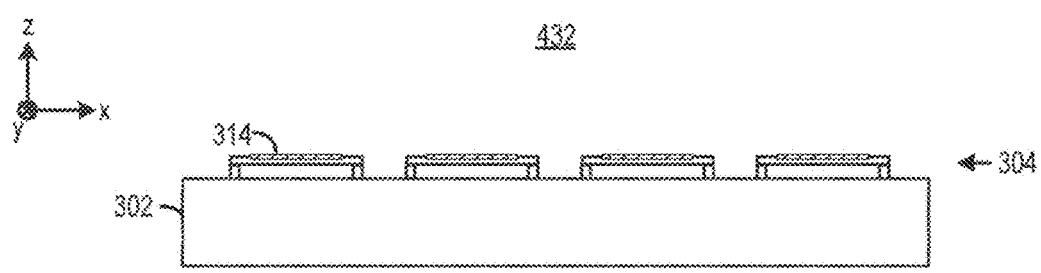

FIG. 4 illustrates the side view of various devices involved in an example process 400 of microfabrication, according to some embodiments. Process 400 can be used to fabricate, for example, array of micro-mirror assemblies 304 on semiconductor substrate 302. Process 400 can be based on shadow mask patterning. As shown in FIG. 4, process 400 starts with step 402, in which a shadow mask 404 is overlaid on semiconductor substrate 302. Shadow mask 404 includes a set of opening patterns 406. Each opening pattern 406 can correspond to a micro-mirror assembly including outer-frame 310, inner-frame 312, micro-mirror 314, as well as connection structures 316, 318, 320, and 322. Polysilicon 408 can be deposited via the pattern of openings 406 onto semiconductor substrate 302. In some examples, outer-frame 310, inner-frame 312, micro-mirror 314, as well as connection structures 316, 318, 320, and 322 can be formed as multiple polysilicon structures, and multiple shadow mask patterning operations can be performed in step 402.

At step 412, polysilicon structures 410 each comprising outer-frame 310, inner-frame 312, micro-mirror 314, as well as connection structures 316, 318, 320, and 322 can be formed on semiconductor substrate 302. The shape of each polysilicon structure can be defined based on opening pattern 406. Shadow mask 404 can then be removed from semiconductor substrate 302.

In step 422, a shadow mask 424 is overlaid on polysilicon structures 410. Shadow mask 424 includes a set of opening patterns 426. Each opening pattern 426 can correspond to the reflective surfaces of micro-mirror 314. Metal 428 can be deposited via the opening patterns 426 onto polysilicon structures 410.

In step 432, metal 428 is deposited onto polysilicon structures 410 to form the reflective surfaces of micro-mirrors 314, and array of micro-mirror assemblies 304 are formed. Shadow mask 424 can then be removed from polysilicon structures 410.

In process 400, the deposition of polysilicon 408 and metal 428 can be based on various deposition processes, such as physical deposition and chemical vapor deposition (CVD). Examples of physical deposition processes include, for example, evaporation, sputtering, spin casting, etc. In physical deposition process, the material to be deposited (e.g., polysilicon 408, metal 428, etc.) can be converted into gaseous form, liquid form, etc., which can then flow through the opening patterns of the shadow mask and deposit onto semiconductor substrate 302. In CVD, the material can be deposited from a vapor by a chemical reaction between the vapor and the semiconductor substrate 302.

In contrast to photolithography where photoresists are applied and etching is performed to perform pattern operating, process 400 does not require the application and removal of photoresists. Therefore, the risk posed by the application and development of photoresists on the fragile micro-mirror assemblies can be avoided. Moreover, no etching is needed to, for example, remove the shadow masks, as the shadow masks can be lifted off by a mechanical device, as to be described below. As a result, shorter processing time and lower processing cost can be achieved.

To use shadow mask to transfer a pattern to a target location, the shadow mask needs to be aligned with the target location. For example, in step 402, shadow mask 404 needs to be aligned with semiconductor substrate 302 so that polysilicon 408 can be deposited at the locations on semiconductor substrate 302 reserved for array of micro-mirror assemblies 304, to form the polysilicon structures 410. Moreover, in step 422, shadow mask 424 also needs to be aligned with semiconductor substrate 302 (or with polysilicon structures 410) so that metal 428 can be deposited at the locations corresponding to micro-mirrors 314 to form the reflective surfaces.

Figure 5:
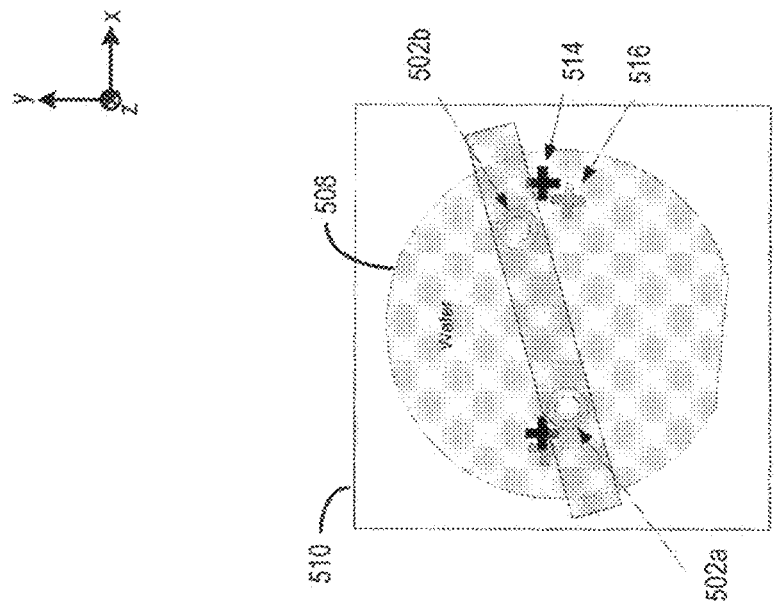
FIG. 5 illustrates an example of apparatus that can use techniques according to embodiments of the present disclosure.
Figure 5:
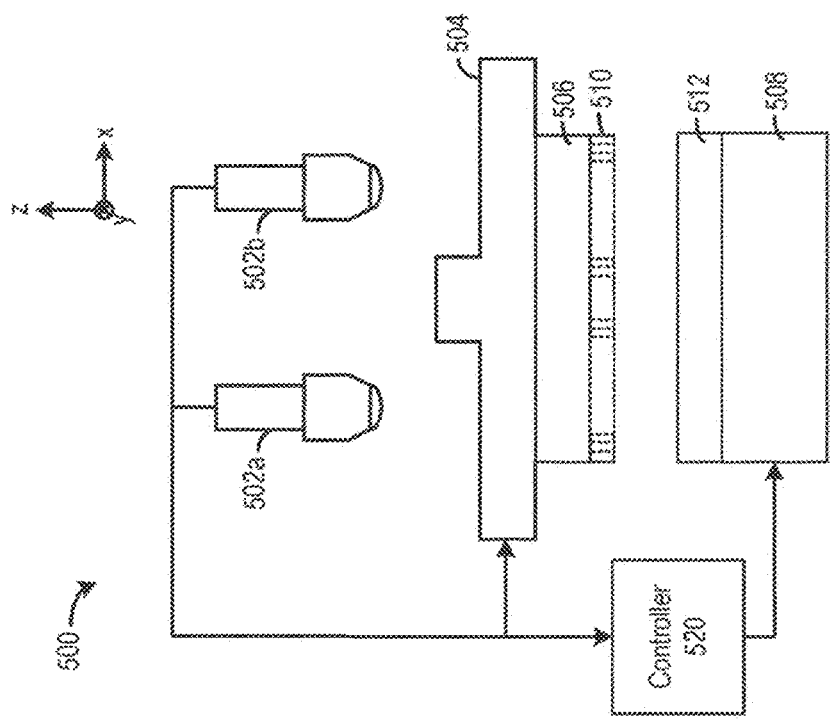

FIG. 5 illustrates an apparatus 500 for performing shadow mask alignment and patterning operations, according to some embodiments. As shown in FIG. 5, apparatus 500 includes imaging devices 502 (e.g., imaging devices 502a and 502b), a carrier substrate holder 504, a carrier substrate 506, and a wafer holder 508. Imaging devices 502 can include microscopes and cameras to capture microscopic images. Carrier substrate 506 can be adhered to a shadow mask 510 (e.g., shadow masks 404 and 424 of FIG. 4) via adhesives. Shadow mask 510 can be handled by carrier substrate holder 504 via carrier substrate 506, whereas wafer holder 508 can handle a wafer 512. As shown in FIG. 5, carrier substrate holder 504 can be in the form a stamp and can attach to carrier substrate 506 via, for example, adhesives, suction cups, etc. Carrier substrate holder 504 can also be in other forms, and can be controlled by a robotic arm (not shown in FIG. 5). Wafer holder 508 can be a rotating wafer holder and can also attach to wafer 512. Wafer holder 508 can also be attached by a robotic arm. Wafer 512 can include semiconductor substrate 302.

At least one of carrier substrate holder 504 or wafer holder 508 can move in different directions, such as along a vertical axis (e.g., parallel with the z-axis), on a horizontal plane (e.g., parallel with x-y plane), and rotate around the vertical axis, to align shadow mask 510 with wafer 512 in an alignment operation. At least one of carrier substrate 506 or shadow mask 510 may include a first alignment mark 514, whereas wafer 512 may include a second alignment mark 516. Carrier substrate 506 (and carrier substrate holder 504) can be made of a transparent material (e.g., glass) which allows imaging devices 502 to receive light reflected from first alignment mark 514 and second alignment mark 516. Imaging devices 502 can capture images of first alignment mark 514 and second alignment mark 516 to determine a degree of alignment between shadow mask 510 and wafer 512. The movement of shadow mask 510 and wafer 512 for the alignment operation can be guided by measuring, for example, overlapping portions between first alignment mark 514 and second alignment mark 516 from the images captured by imaging devices 502.

In some examples, apparatus 500 can be part of a contact aligner. Before an alignment operation, a plurality of wedge error compensation (WEC) balls (or other types of proximity flags) can be positioned between shadow mask 510 and wafer 512 to keep the mask and wafer parallel with each other, to set the initial relative positions of the carrier substrate holder 504 and wafer holder 508. And then the WEC balls can be removed, and at least one of carrier substrate holder 504 or wafer holder 508 can move along the vertical axis to bring shadow mask 510 and wafer 512 together until they are separated by an alignment gap. The alignment gap can be configured as a minimum distance required to prevent physical contact between shadow mask 510 and wafer 512. Such arrangement can prevent the wafer 512 from exerting a shear force onto shadow mask 510 (and vice versa) which can shift the shadow mask from the aligned position obtained from the alignment operation. As to be described below, shadow mask 510 may have an adhesive layer to adhere to wafer 512 to maintain shadow mask 510 and wafer 512 at their relative aligned positions after the alignment operation completes. The alignment gap can be set based on the thickness of the adhesive layer to prevent the adhesive layer from touching wafer 512 during the alignment operation. In addition, the alignment gap is also be configured based on the maximum distance allowed by imaging devices 502 to focus on first alignment mark 514 and second alignment mark 516 for measuring, for example, overlapping areas between the alignment marks to determine a degree of alignment, which necessitates bringing shadow mask 510 and wafer 512 together. In some embodiments, apparatus 500 may include a laser displacement sensor, a sensor to track the movement of a linear motor coupled with wafer holder and/or the carrier substrate holder, etc. to monitor the separation between shadow mask 510 and wafer 512, to control the vertical movements of carrier substrate holder 504 and wafer holder 508.

The alignment operation can be controlled by a controller 520 coupled with imaging devices 502 and the robotic arms coupled with carrier substrate holder 504 and wafer holder 508. During the alignment operation, as shown on the right of FIG. 3, controller 520 can cause at least one of carrier substrate 506 (and shadow mask 510) or wafer 512 to be rotated, and/or moved linearly along the x and y axes, with respect to each other to perform the alignment. The movements can be caused by the robotic arms attached to carrier substrate holder 504 and wafer holder 508 under the control of controller 520. Controller 520 can determine the movement based on images of first alignment mark 514 and second alignment mark 516. For example, based on the images, controller 520 can determine overlapping portions between the alignment marks and, based on the overlapping portions, determine the movements to maximize the overlapping portions. After the movement, controller 520 can reassess the degree of alignment based on new images of the alignment marks, and determine whether additional movements are needed. The alignment operation can complete when, for example, the degree of alignment (e.g., based on a percentage of overlapping areas between the alignment marks) exceeds a threshold. At the end of the alignment operation, the relative aligned positions of shadow mask 510 and wafer 512 determined on the x-y plane can be determined.

After the alignment operation completes, at least one of carrier substrate holder 504 or wafer holder 508 can move along the vertical axis to bring shadow mask 510 and wafer 512 into contact. The shadow mask 510 may include an adhesive layer which can hold shadow mask 510 and wafer 512 at their relative aligned positions upon contact. Carrier substrate 506 can then be disconnected from shadow mask 510 by weakening the adhesion between carrier substrate 506 and shadow mask 510, to expose shadow mask 510. Deposition of materials (e.g., polysilicon, metal, etc.) can then be performed via the opening patterns of shadow mask 510 onto wafer 512.

FIG. 6 illustrate a microfabrication process 600 using shadow mask patterning operations, whereas FIG. 7A-7D illustrate side views of devices involved in process 600. Process 600 can be part of process 400 to transfer different patterns (e.g., polysilicon structure 410, reflective areas of micro-mirror 314, etc.) onto semiconductor substrate 302. Process 600 can be performed by, for example, apparatus 500 of FIG. 5.

Process 600 starts with step 602, in which a first surface of mask 702 (e.g., shadow mask 510 of FIG. 5) is adhered to a carrier substrate 704 (e.g., carrier substrate 506 of FIG. 5) via a first adhesive layer 706. Mask 702 may include a pattern of openings. In some embodiments, as shown in FIG. 7A, first adhesive layer 706 can be applied to first surface 707 of carrier substrate 704 in step 602a, and then mask 702 can be brought towards first surface 707 of carrier substrate 704 to contact first adhesive layer 706, and mask 702 can be adhered to carrier substrate 704 in step 604b. In some embodiments, as shown in FIG. 7B, first adhesive layer 706 can also be applied to mask 702, in step 604c. Mask 702 can be brought towards carrier substrate 704 to enable first adhesive layer 706 to contact first surface 707 of carrier substrate 704, and mask 702 can be adhered to carrier substrate 704 in step 604d.

Referring to FIG. 6 and FIG. 7C, in step 604, a second adhesive layer 710 can be formed on at least one of a second surface 712 of mask 702, or a third surface 714 of a wafer 716 facing second surface 712. Second surface 712 can be on an opposite side of the mask relative to first surface 707. At least one of carrier substrate 704 or mask 702 can include a first alignment mark, whereas third surface 714 of wafer 716 can include a second alignment mark. Carrier substrate 704 can include a transparent material (e.g., glass) to allow imaging of the first and second alignments for the alignment operation.

As shown in FIG. 7C, second surface 712 and third surface 714 can be kept parallel with each other by a plurality of wedge error compensation (WEC) balls 718 (e.g., WEC balls 718a and 718b). Each of WEC balls 718 can have the same diameter 720 which can set the distance between second surface 712 and third surface 714 at equal distance. The WEC balls can be used to set the initial relative positions of the mask 702 and wafer 716. The WEC balls can be positioned to avoid the opening patterns of mask 702. Second adhesive layer 710 can be formed at locations on second surface 712 and/or third surface 714 that are not in contact with WEC balls 718. Second adhesive layer 710 can be used to adhere mask 702 to wafer 716 to hold mask 702 and wafer 716 at their relative aligned positions obtained from an alignment operation, as to be described below.

In some embodiments, first adhesive layer 706 and second adhesive layer 710 can have different adhesive strengths, and/or the adhesiveness can be weakened by different agents, etc., to enable the disconnection of the mask from the carrier substrate while maintaining the adhesion of the mask to the semiconductor substrate at the aligned position. For example, the first adhesive layer can be a UV tape of which the adhesiveness can be weakened by UV light projected through transparent carrier substrate 704, whereas the second adhesive layer can be a thermal tape of which the adhesiveness can be weakened by heat. As another example, the second adhesive layer may require a larger force to break the layer than the first adhesive layer.

Referring to FIG. 6 and FIG. 7C, following the formation of second adhesive layer 710 in step 604, the WEC balls between the second surface and the third surface can be removed, in step 606. Following the removal of the WEC balls, the carrier substrate and the wafer can be brought together along a vertical axis such that the second surface of the mask and the third surface of the wafer is separated by an alignment gap 722 along the vertical axis, in step 608. Step 608 can be performed by, for example, moving carrier substrate holder 504, moving wafer holder 508, or by combination of both. As explained above, reducing the distance between second surface 712 of mask 702 and third surface 714 of wafer 716 can improve the focus imaging of the overlapping portions between the first alignment mark and the second alignment mark during the alignment operation. The alignment gap can be determined based on, for example, a thickness of second adhesive layer 710 to prevent the second adhesive layer (or other parts of the second surface of mask 702) from coming into contact with third surface 714 of wafer 716, to prevent introducing shear force on the mask which can disturb the alignment operation.

With the second surface of the mask and the third surface of the wafer separated by the alignment gap, an alignment operation can be performed in steps 610 and 612. In step 610, at least one of the carrier substrate or the wafer can be moved on a horizontal plane perpendicular to the vertical axis to increase an overlapping area between the first alignment mark (on at least one of the mask or the carrier substrate) and the second alignment mark (on the third surface of the wafer). The overlapping area can be determined based on microscopic images captured by imaging devices 502a and 502b via carrier substrate 704, in step 612. If the overlapping area exceeds a threshold, which indicates that the wafer is aligned with the mask, the alignment operation can stops, otherwise step 610 can be repeated.

After the alignment operation stops, the carrier substrate and the wafer can be brought further together along the vertical axis such that the second adhesive layer adheres the carrier substrate to the wafer, in step 614. As a result of the adhesion, mask 702 and wafer 716 can be held together in their relative aligned positions (obtained via steps 610 and 612) to prepare for the subsequent material deposition operation.

In step 616, with the second adhesive layer holding the mask and the semiconductor substrate together, the carrier substrate can be disconnected from the mask. For example, first adhesive layer 706 can be weakened while second adhesive layer 710 remains. The first adhesive layer can be weakened by agents including, for example, heating, projecting UV light, laser light, etc. via the transparent carrier substrate 704, by a first force that moves carrier substrate 704 away from mask 702, etc. The agent may either do not weaken the second adhesive layer, or weaken the second adhesive layer to a smaller degree, so that the second adhesive layer can hold the mask and the wafer at their relative aligned positions. For example, the first adhesive layer 706 can be a UV tape that is weakened by UV light but not by heat, whereas second adhesive layer 710 can be a thermal tape that is weakened by heat but not by UV light. As another example, first adhesive layer 706 can be a thermal tape whereas second adhesive layer 710 can be a UV tape. As another example, first adhesive layer 706 can be broken apart/weakened by a first force which is insufficient to break or weaken second adhesive layer 710. After the first adhesive layer is weakened, at least one of the carrier substrate holder or the wafer holder can be operated to move wafer 716 and mask 702 away from carrier substrate, to disconnect carrier substrate 704 from mask 702 (and wafer 716).

With the carrier substrate disconnected from the mask, a deposition process can be performed in step 618. As part of the deposition process, a material, such as a metal, can be deposited via the pattern of openings of mask 702 to form a pattern of the material on the third surface of wafer 716. The deposition process can include, for example, a physical deposition process (e.g., evaporation, sputtering, spin-on, etc.), a chemical deposition process, etc., as described above.

After the deposition process completes, the mask can be disconnected from the third surface of the wafer based on weakening the second adhesive layer, in step 620. In some examples, the second adhesive layer can be weakened by heating, UV light, laser light, a larger force than the force used to break the first adhesive layer to move the mask away from the wafer, etc. After the second adhesive layer is weakened, the carrier substrate holder can be operated to pull the mask away from the semiconductor substrate to prepare for subsequent operations.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the embodiments, alternative embodiments, etc., and the concepts thereof may be applied to any other embodiments described and/or within the spirit and scope of the disclosure.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

What is claimed is:

1. A method, comprising:
    adhering a first surface of a mask to a carrier substrate via a first adhesive layer, at least one of the mask or the carrier substrate having a first alignment mark, the mask having a pattern of openings;
    forming a second adhesive layer on at least one of a second surface of the mask or a third surface of a wafer having a second alignment mark, the second surface being on an opposite side of the mask relative to first surface, the second surface and the third surface being kept parallel with each other by a plurality of proximity flags, the proximity flags not in contact with the second adhesive layer;
    removing the proximity flags;
    bringing the carrier substrate and the wafer towards each other along a vertical axis such that the second surface of the mask and the third surface of the wafer is separated by an alignment gap based on a thickness of the second adhesive layer;
    performing an alignment operation based on imaging the first alignment mark and the second alignment mark, the alignment operation comprising moving at least one of the carrier substrate or the wafer on a horizontal plane perpendicular to the vertical axis when the mask is separated from the third surface by a distance;
    after the alignment operation completes:
        bringing the carrier substrate and wafer towards each other along the vertical axis such that the second surface of the mask adheres to the third surface of the wafer via the second adhesive layer;
        disconnecting the carrier substrate from the mask based on weakening the first adhesive layer when the mask remains adhered to the third surface via the second adhesive layer;
        depositing material via the pattern of openings of the mask to form a pattern of material on the third surface of the wafer; and
        after forming the pattern of material on the third surface, disconnecting the mask from the third surface based on weakening the second adhesive layer.

2. The method of claim 1, wherein the carrier substrate comprises a material that transmits visible light.

3. The method of claim 2, wherein the carrier substrate comprises glass.

4. The method of claim 1, further comprising:
    forming the first adhesive layer on the first surface of the mask; and
    bringing the mask and the carrier substrate together such that the first adhesive layer adheres the first surface of the mask to the carrier substrate.

5. The method of claim 1, further comprising:
    forming the first adhesive layer on a surface of carrier substrate facing the first surface of the mask; and
    bringing the mask and the carrier substrate together such that the first adhesive layer adheres the first surface of the mask to the carrier substrate.

6. The method of claim 1, wherein the first adhesive layer and the second adhesive layer have different adhesion strength.

7. The method of claim 1, wherein:
    the first adhesive layer is weakened by a first agent but not by a second agent;
    the second adhesive layer is weakened by the second agent but not by the first agent.

8. The method of claim 1, wherein:
    the first adhesive layer is weakened by a larger degree by a first agent than by a second agent; and
    the second adhesive layer is weakened by a larger degree by the second agent than by the first agent.

9. The method of claim 1, wherein the first adhesive layer is a thermal tape and the second adhesive layer is an ultra-violet (UV) tape; or
    wherein the first adhesive layer is the UV tape and the second adhesive layer is the thermal tape.

10. The method of claim 1, wherein weakening the first adhesive layer comprising breaking the first adhesive layer apart by applying a first force to at least one of the carrier substrate or the wafer; and
   wherein weakening the second adhesive layer comprises breaking the second adhesive layer apart by applying a second force larger than a first force to at least one of the mask or the wafer.

11. The method of claim 1, wherein bringing the carrier substrate and the wafer towards each other along a vertical axis comprises at least one of:
   controlling a movement of a carrier substrate holder attached to the carrier substrate along the vertical axis; or
   controlling a movement of a wafer holder attached to the wafer along the vertical axis.

12. The method of claim 1, wherein the alignment operation comprises:
   obtaining, from an imaging device, images of the first alignment mark and the second alignment mark;
   determining, based on the images, an overlapping area between the first alignment mark and the second alignment mark;
   moving at least one of the carrier substrate or the wafer on the horizontal plane based on the overlapping area; and
   determining that the alignment operation completes based on the overlapping area exceeding a threshold.

13. The method of claim 1, wherein weakening the first adhesive layer comprises at least one of: projecting a UV light to the first adhesive layer via the carrier substrate, projecting a laser light to the first adhesive layer via the carrier substrate, heating the carrier substrate, or by a first force that separates the mask from the carrier substrate.

14. The method of claim 1, wherein weakening the second adhesive layer comprises at least one of: projecting a UV light to the second adhesive layer via the mask, projecting a laser light to the second adhesive layer via the mask, heating the mask, or by a second force that separates the mask from the wafer.

15. The method of claim 1, wherein the material is deposited using at least one of: a physical deposition process, or a chemical vapor deposition process.

16. The method of claim 1, wherein the material is a metal.

17. The method of claim 1, wherein the mask is made of: stainless steel, glass, plastic, or a semiconductor material.

18. The method of claim 1, wherein the mask is a shadow mask.

19. The method of claim 1, wherein the carrier substrate is made of glass.

20. The method of claim 1, wherein the proximity flags comprise wedge error compensation (WEC) balls.

* * * * *